United States Patent
Dunn et al.

(10) Patent No.: US 10,871,369 B2
(45) Date of Patent: Dec. 22, 2020

(54) SYSTEMS FOR AND METHODS OF MEASURING PHOTOMASK FLATNESS WITH REDUCED GRAVITY-INDUCED ERROR

(71) Applicant: CORNING INCORPORATED, Corning, NY (US)

(72) Inventors: Thomas James Dunn, Penfield, NY (US); John Weston Frankovich, Fairport, NY (US); Robert Dennis Grejda, Fairport, NY (US); Christopher Alan Lee, Pittsford, NY (US); Matthew Ronald Millecchia, Fairport, NY (US); Yoshihiro Nakamura, Saitama (JP)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/527,917

(22) Filed: Jul. 31, 2019

(65) Prior Publication Data

US 2020/0041248 A1    Feb. 6, 2020

Related U.S. Application Data

(60) Provisional application No. 62/713,831, filed on Aug. 2, 2018.

(51) Int. Cl.
*G01B 11/30* (2006.01)
*G01B 9/02* (2006.01)
(Continued)

(52) U.S. Cl.
CPC ........ *G01B 11/306* (2013.01); *G01B 9/02075* (2013.01); *G01B 11/2441* (2013.01);
(Continued)

(58) Field of Classification Search
CPC .............. G01B 11/2441; G01B 11/306; G01B 9/02075; G03F 1/84; G03F 1/22; G03F 7/707; G03F 7/70783; G06K 9/74
See application file for complete search history.

(56) References Cited

U.S. PATENT DOCUMENTS 6,537,844 B1    3/2003 Itoh
6,717,680 B1 *  4/2004 Kuchel .............. G01B 11/2441
                                                  356/514
(Continued)

FOREIGN PATENT DOCUMENTS

DE    102006059440 A1    6/2008
JP         5291112 A     11/1993
(Continued)

OTHER PUBLICATIONS

Battula et al; "Mounting Methodologies to Measure EUV Reticle Flatness"; Proceedings of SPIE, 7470; 2009 pp. 747014-1-747014-14.
(Continued)

*Primary Examiner* — Michael P LaPage
(74) *Attorney, Agent, or Firm* — Kevin L. Bray (57) ABSTRACT

The methods disclosed herein include recording at near-vertical first and second measurement positions respective first and second interferograms of the photomask surface and defining a difference map as the difference between the first and second interferograms. Respective first and second normal forces on the photomask are also measured at the first and second measurement positions. The change in the normal force is used define a scaling factor, which is applied to the difference map to define a scaled difference map. A compensated flatness measurement with a reduced shape contribution due to gravity is obtained by subtracting the scaled difference map from the first interferogram. An
(Continued)

interferometer-based flatness measurement system is also disclosed.

13 Claims, 7 Drawing Sheets

(51) Int. Cl.
    *G01B 11/24* (2006.01)
    *G03F 1/22* (2012.01)
    *G03F 7/20* (2006.01)
    *G03F 1/84* (2012.01)

(52) U.S. Cl.
    CPC .................. *G03F 1/22* (2013.01); *G03F 1/84* (2013.01); *G03F 7/70783* (2013.01)

(56) References Cited

U.S. PATENT DOCUMENTS

| | | | |
|---|---|---|---|
| 6,883,158 B1 | 4/2005 | Sandstrom et al. | |
| 6,950,176 B1 | 9/2005 | LaFontaine et al. | |
| 6,951,502 B2 | 10/2005 | Koike et al. | |
| 7,239,376 B2 | 7/2007 | Hibbs et al. | |
| 8,455,158 B2 | 6/2013 | Tanabe | |
| 2006/0086193 A1* | 4/2006 | Ueki | G03F 7/70591 73/856 |
| 2006/0126077 A1 | 6/2006 | Ueki et al. | |
| 2007/0024831 A1 | 2/2007 | Hibbs et al. | |
| 2007/0059608 A1 | 3/2007 | Ikuta et al. | |
| 2011/0262846 A1* | 10/2011 | Tanabe | G03F 1/60 430/5 |
| 2018/0293720 A1* | 10/2018 | Yoshitake | G03F 1/70 |

FOREIGN PATENT DOCUMENTS

| | | |
|---|---|---|
| JP | 2007053502 A | 3/2007 |
| JP | 2008004467 A | 1/2008 |
| KR | 2013007088 A | 1/2013 |
| WO | 2019074911 A1 | 4/2019 |

OTHER PUBLICATIONS

Bunnagel et al; "Fizeau Interferometer for Measuring the Flatness of Optical Surfaces"; Applied Optics, vol. 7, No. 2; 1968; pp. 331-336.

Evans et al; "Chuck Induced Deformations in EUV Mask Substrate Metrology "; Zygo Corporation; 5 pages; Date Unknown.

Lindquist et al; "High-Resolution Tool for Measuring Photomask Flatness"; Proceeding of SPIE, vol. 5130; 2003; pp. 528-532.

Moona et al; "Evaluation of Measurement Uncertainty for Absolute Flatness Measurement by Using Fizeau Interferometer With Phase-Shifting Capability"; Journal of Metroloty Society of India; 29 (4); 2014; pp. 261-267.

Griesmann et al; "Optical Flatness Metrology for 300mm Silicon Wafers "; National Institute of Standards and Technology, 5 pages; Date Unknown.

Otsuka et al; "Development of a Fizeau Interferometer for Measuring Free Form Flatness"; Asahi Glass Company, 2005 EUVL Symposium; 13 Pages.

Quabis et al; "Intercomparison of Flatness Measurements of an Optical Flat at Apertures of Up to 150mm in Diameter"; Metrologia; 54 (2017) pp. 85-93.

Sasaki et al; "Absolute Measurement of Optical Surface Profile With a Fizeau Interferometer"; Proc. of SPIE, vol. 8563; 2012; pp. 85630B-1-85630B-7.

Schulz et al; "Absolute Flatness Testing by the Rotation Method With Optimal Measuring-Error Compensation"; Applied Optics, vol. 31, No. 19; 1992; pp. 3767-3780.

Schulz; "Absolute Flatness Testing by an Extended Rotation Method Using Two Angles of Rotation"; Applied Optics, vol. 32, No. 7; 1993; pp. 1055-1059.

Xu et al; "Method for Absolute Flatness Measurement of Optical Surfaces"; Applied Optics, vol. 48, No. 13, 2009; pp. 2536-2541.

International Search Report and Written Opinion of the European International Searching Authority; PCT/US2019/043663; dated Nov. 19, 2019; 18 Pgs.

* cited by examiner

*Prior Art*

SYSTEMS FOR AND METHODS OF MEASURING PHOTOMASK FLATNESS WITH REDUCED GRAVITY-INDUCED ERROR

This application claims the benefit of priority to U.S. Provisional Application Ser. No. 62/713,831 filed on Aug. 2, 2018, the content of which is relied upon and incorporated herein by reference in its entirety.

FIELD

The present disclosure relates to photomasks used in optical lithography, and in particular relates to a method of measuring the flatness of a photomask with reduced gravity-induced error.

BACKGROUND

Optical lithography is a process used in the fabrication of microelectronic devices to transfer images from a master pattern on a photomask (reticle) to a semiconductor wafer having a photosensitive coating. Once the photosensitive coating has been exposed, the substrate is processed to permanently etch the pattern into the wafer or to replace the exposed pattern with a new material. This process is repeated many times until the final microelectronics device is completed.

EUV (extreme ultraviolet) optical lithography is the next-generation patterning process that utilizes EUV wavelengths (10 nm-70 nm; e.g., 13.5 nm) to enable the manufacturing of faster devices by creating patterns with smaller lines and spaces than is possible with longer wavelengths. This requires that the planarity of the patterned surface of the photomask deviate less than 30 nm from an ideal plane. This flatness requirement has led to the use of flatness interferometers to monitor and control the photomask flatness during the manufacturing process of the reticle. For good process control, these interferometers need to measure photomask flatness with high accuracy and repeatability.

In EUV optical lithography, the photomask is electrostatically clamped onto a flat chuck and EUV light is reflected from the patterned side and imaged to the substrate using an all-reflective EUV optical system. This imaging process is very sensitive to flatness errors of the patterned surface, with deviations of the patterned surface from an ideal plane leading to image placement errors on the substrate. Furthermore, the clamping process transfers flatness errors from the back side of the photomask to the patterned front side. This makes it necessary for the flatness interferometers to measure the flatness of both sides of the photomask.

The present approach for determining photomask flatness is to employ a Fizeau interferometer with the photomask supported in a near-vertical position, e.g., between 1° and 4° from vertical. The surface of the photomask being measured is held closely to a reference surface whose flatness is well-characterized. A coherent laser source illuminates both the reference and measurement surface simultaneously to generate an interferogram. Multiple interferograms can be generated to perform phase measurement interferometry (PMI).

The closer the photomask is held to the vertical orientation, the less influence it will see from gravity; however, it will be more susceptible to vibrations, which adversely affects the quality of the flatness measurement and it will also be more likely to fall off the support apparatus. Typically, photomasks are measured at 2° from vertical to balance the influences from vibration and gravity on the flatness measurement. In addition, the photomask is rotated in 90° increments along an axis normal to the surface and measured at the four different orientations. The measurement data is then re-aligned and recombined to yield one measurement of the photomask surface that further reduces measurement errors due to gravity. To characterize both the front and back side of the photomask, the photomask needs to be positioned on the flatness interferometer eight different times.

This technique minimizes the non-symmetric portion of the gravity-induced shape since they cancel when the measurements for a given surface are averaged together. Unfortunately, the symmetric portion does not cancel and typically contributes about 10 nm of error (mostly power) in the measured photomask flatness. This amount of residual error is substantial and so results in a non-ideal flatness measurement.

SUMMARY

Both modeling and experimental data have confirmed that the shape induced on a near-vertical photomask caused by gravity is a linear function of the tilt angle at which the photomask is measured. This tilt angle is referred to herein as the measurement angle. For each measurement angle we record readings from force sensors incorporated into the support apparatus, wherein the force sensors measure the component of the force on the photomask by gravity and from the support apparatus.

Subtracting two flatness measurements of the photomask performed at two different measurement angles yields a measurement of the change in shape induced on the mask due to the change in gravitation force on the photomask. Since this shape is linear with the measurement angle, a difference map that reflects the change to the photomask due to the combined influence of gravity and the support fixture at any measurement angle can be established. Subtracting this difference map from a mask measurement at the corresponding measurement angle results in a flatness measurement having reduced error contributions from gravity and the support fixture.

Thus, in one example method, the flatness of the photomask is measured at two different measurement angles such as 2° and at 3° (relative to vertical) and the two flatness measurements are subtracted from each other. The result is a difference map, which contains the gravitational error that would result from the incremental measurement angle of 1°. If the difference map is multiplied by a scaling factor S=2, the gravitational error from the flatness measurement at a measurement angle of 2° can be removed by subtracting the scaled difference map from the 2° flatness measurement. The difference map can also include shape errors due to the support members.

An embodiment of the disclosure is a method of interferometrically measuring flatness of a photomask. The method comprises: recording at first and second measurement positions respective first and second interferograms of a surface of the photomask, and measuring respective first and second normal forces $F_1$ and $F_2$ for at the at least one support location, wherein the first and second measurement positions define a difference $\Delta F = F_2 - F_1$ in the normal force; defining a difference map as a difference between the first and second interferograms; and using the difference in normal force $\Delta F$ and the normal force $F_1$ at the first measurement position to define a scaling factor S and applying the scaling factor S to the difference map to define a scaled difference map. The method can further comprise defining a compensated flatness by subtracting the scaled difference map from the first interferogram.

An embodiment of the disclosure is a method of interferometrically measuring flatness of a photomask. The method comprises: recording at first and second measurement angles $\theta_1$ and $\theta_2$ respective first and second interferograms $IF_1$ and $IF_2$ of a surface of the photomask supported by an adjustable support apparatus, wherein $\theta_2 > \theta_1$ and wherein $\theta_1$ and $\theta_2$ are each within 0.2 radians of vertical; measuring at the first and second measurement angle $\theta_1$ and $\theta_2$ respective first and second normal forces $F_1$ and $F_2$ of the photomask on the adjustable support apparatus, wherein a force difference $\Delta F = F_2 - F_1$; defining a difference map DM as a difference between the first and second interferograms $IF_2$ and $IF_1$; defining either a first scaled difference map $DM_1 = (F_1/\Delta F) \cdot DM$ or a second scaled difference map $DM_2 = (F_2/\Delta F) \cdot DM$; and defining a compensated flatness measurement CFM by either: i) subtracting the first difference map from the first interferogram ($CFM = IF_1 - DM_1$); or ii) subtracting the second difference map from the second interferogram ($CFM = IF_2 - DM_2$).

An embodiment of the disclosure is a support apparatus for an interferometric measurement system for measuring flatness of a photomask having a back surface, a bottom end and a top end. The support apparatus comprises: a support base comprising two base support members that support the bottom end of the photomask and a top support member that supports the photomask at or adjacent the top end of the photomask; a rotation device mechanically attached to the support base and configured to rotate the support base to a measurement position relative to the interferometric measurement system; a top force sensor in mechanical communication with the top support member; and wherein the at least three support members are arranged to mechanically support the photomask by contacting the photomask so that the top force sensor measures an amount of force on the top support member from the photomask due to gravity.

An embodiment of the disclosure is an interferometric flatness measurement system for measuring flatness of a photomask that comprises the support assembly as disclosed herein and that further comprises an interferometer operably arranged adjacent the support assembly and that is tiltable relative to the support assembly.

An embodiment of the disclosure is a method of measuring flatness of a photomask. The method comprises: positioning a photomask at a first measurement position, the first measurement position having a first measurement angle $\theta_1$ relative to a vertical direction; recording a first interferogram $IF_1$ of a surface of the photomask at the first measurement position; repositioning the photomask to a second measurement position, the second measurement position having a second measurement angle $\theta_2$ relative to the vertical direction; recording a second interferogram $IF_2$ of the surface of the photomask at the second measurement position; computing a difference map DM by subtracting the first interferogram $IF_1$ from the second interferogram $IF_2$; and computing a scaled difference map $DM_\theta$ by multiplying the difference map DM by a scaling factor S, the scaling factor S being computed from a first measurement of the photomask made at the first measurement position and a second measurement of the photomask made at the second measurement position.

In an example of the method, the first measurement is a measurement of the first measurement angle $\theta_1$ and the second measurement is a measurement of the second measurement angle $\theta_2$.

Also in an example of the method, the scaling factor S is inversely proportional to a difference $\theta_2 - \theta_1$ between the second measurement angle $\theta_2$ and the first measurement angle $\theta_1$, such as $S = \theta_2/(\theta_2 - \theta_1)$ or $S = \theta_1/(\theta_2 - \theta_1)$.

Further in an example of the method, the first measurement is a measurement of a normal force $F_1$ at a first location of the photomask positioned at the first measurement position and the second measurement is a measurement of a normal force $F_2$ at a second location of the photomask positioned at the second measurement position.

Further in an example of the method, the scaling factor S is inversely proportional to a difference $F_2 - F_1$ between the normal force $F_2$ at the second measurement position and the normal force $F_1$ at the first measurement position, such as $S = F_2/(F_2 - F_1)$ or $S = F_1/(F_2 - F_1)$.

Also in an example of the method, the first location is the same as the second location.

Another example of the method comprises subtracting the scaled difference map $DM_\theta$ from first interferogram $IF_1$. Further in the example, the scaling factor $S = \theta_1/(\theta_2 - \theta_1)$ or $S = F_1/(F_2 - F_1)$.

The systems and methods disclosed herein can be applied to any type of photomask and are particularly useful for EUV photomasks since such photomasks require a high degree of flatness to obtain adequate image transfer to the photosensitive material (photoresist) on the wafer.

Additional features and advantages are set forth in the Detailed Description that follows, and in part will be apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description explain the principles and operation of the various embodiments. As such, the disclosure will become more fully understood from the following Detailed Description, taken in conjunction with the accompanying Figures, in which.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

Relative terms like top, bottom, side, horizontal, vertical, etc. are used for convenience and ease of explanation and are not intended to be limiting as to direction or orientation, unless otherwise specified.

Cartesian coordinates are shown in some of the Figures for the sake of reference and are not intended to be limiting as to direction or orientation. The direction of gravity is taken to be in the vertical direction V, which corresponds to the −y direction, and wherein the horizontal plane is the x-z plane.

The term "near vertical" with reference to a measurement angle as introduced below means within 11.46° (0.2 radians) of vertical.

The terms "first measurement position" and "second measurement position" or "first measurement angle" and "second measurement angle" as used herein are not intended to imply a specific temporal or spatial order to the measurement position or the measurement angle when carrying out the methods disclosed herein or adjusting the systems disclosed herein, so that for example setting the photomask to the first measurement angle (position) can be performed after having set the photomask to the second measurement angle (position). The terms "first" and "second" are used in this context to indicate that the measurement angles (positions) being considered are different, and is equivalent to saying "one measurement angle (position)" and "another measurement angle (position)."

The Photomask

Figure 1:
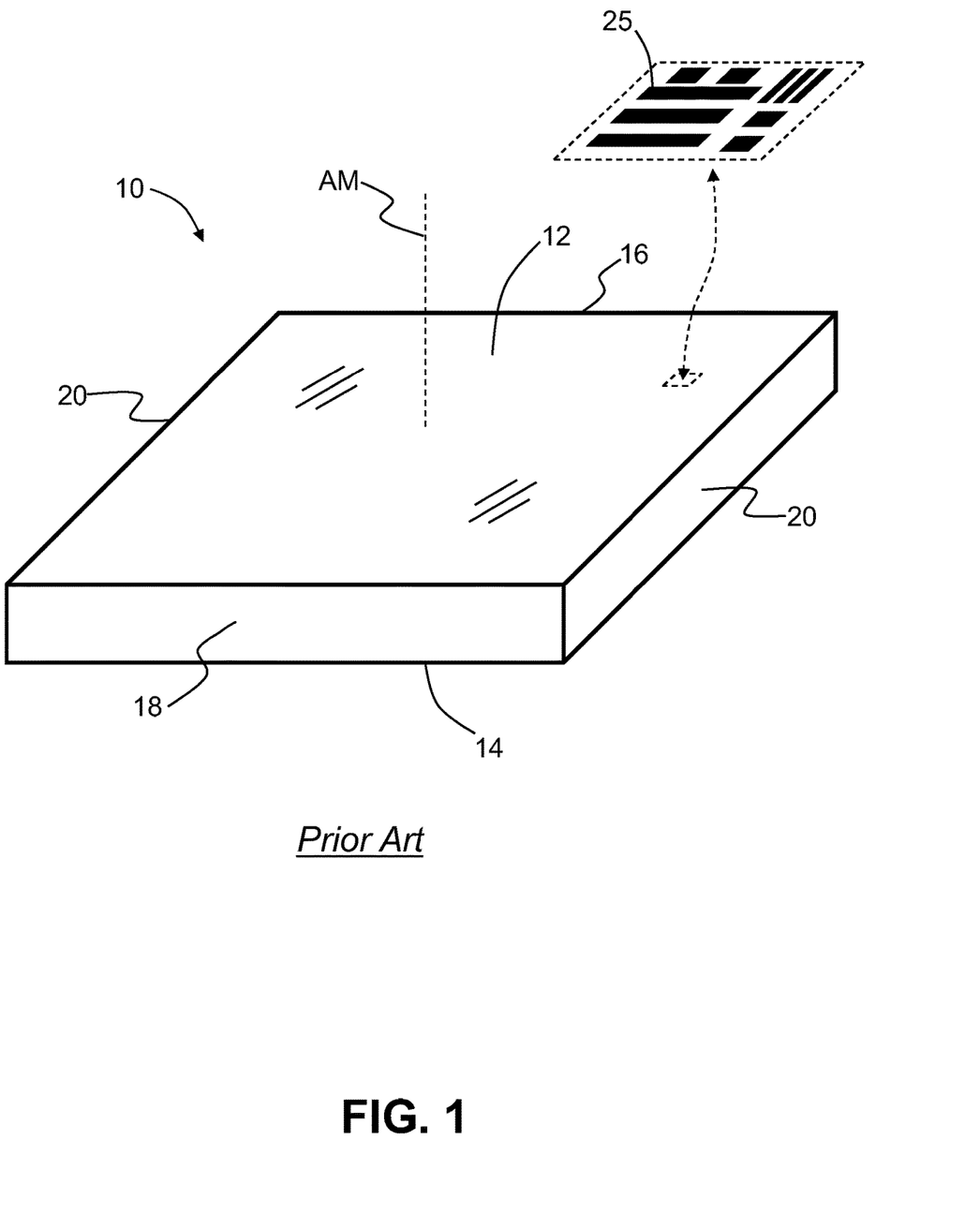
FIG. 1 is a top elevated view of an example photomask, with the close-up inset showing an example of the pattern on the top surface.

FIG. 1 is a top elevated view of an example photomask 10. The photomask 10 has a top surface 12, a back surface 14, a top end 16, a bottom end 18 and opposite edges 20. The photomask 10 also has a length L, a width W, a thickness TH, and central axis AM that is normal to the top surface 12. The top surface 12 and the back surface 14 are substantially parallel to one another and are polished flat. The top end 16 and bottom end 18 are parallel to each other, as are the opposite edges 20. Thus, in an example the photomask 10 has a rectangular cuboid geometry. Example photomasks 10 have L×W×TH dimensions of 6"×6"×(0.120" or 0.250") or 5"×5"×0.090" or 3"×5"×0.090". The systems and methods described herein can be applied to photomasks 10 having a variety of dimensions.

The top surface 12 can be patterned with features 25, as shown in the close-up inset. In an example of an EUV photomask, the features 25 are absorbing at the EUV wavelength (e.g., 13.5 nm) while the top surface 12 of the photomask is reflective. In an example, an EUV photomask is made reflective by forming a multilayer reflective thin-film stack (not shown) on top surface 12, such as by forming forty to fifty alternating layers of molybdenum (Mo) and silicon (Si), atop a photomask substrate. Low thermal expansion materials (e.g. $TiO_2$—$SiO_2$ glass) are preferred photomask substrate materials. In the description below, the photomask 10 is treated as a single substrate for ease of illustration and discussion. It is also noted that a photomask 10 that does have a reflective layer on top surface 12, but does not yet have features 25 on the reflective thin-film stack is referred to as a blank photomask, while a photomask having features 25 on a reflective thin-film stack is referred to as a patterned photomask. A photomask 10 which does not have a reflective layer and consists only of a substrate is referred to as a photomask substrate. The systems and methods disclosed herein can be used on a blank photomask or a photomask substrate, as well as a patterned photomask, as well as at any of the photomask-forming steps between a photomask substrate and a patterned photomask. Unless otherwise specified, the term "photomask" without further qualification refers to any of a photomask substrate, a blank photomask, or a patterned photomask.

Flatness Measurement System

Figure 2A:
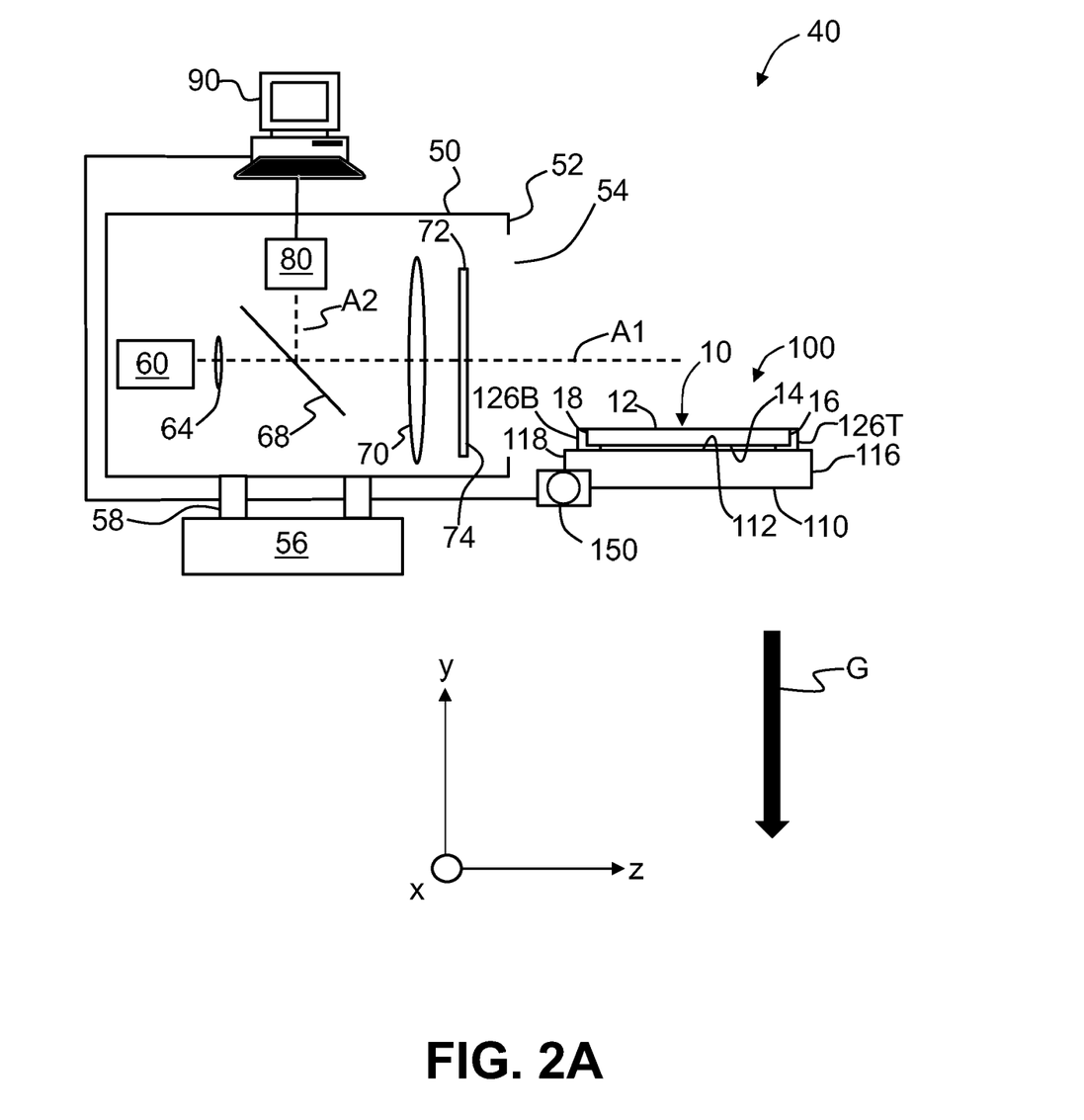
FIG. 2A is a schematic diagram of an example interferometer-based flatness measurement system used to measure the flatness of a photomask, with the support apparatus shown in the horizontal position used to load the photomask.

FIG. 2A is a schematic diagram of an example flatness measurement system ("system") 40 used to measure the flatness of the photomask 10.

The system 40 includes an interferometer 50, which in example is a Fizeau interferometer. An example mask flatness measurement system that employs a Fizeau interferometer is the UltraFlat™ 200 Mask System from Corning Tropel Corporation, Fairport, N.Y.

The example interferometer 50 has a central axis ("interferometer axis") A1 and a front end 52 with an aperture 54. The interferometer 50 is tiltable, as explained below. The example interferometer 50 also includes, in order along the interferometer axis A1, a laser light source 60 (e.g., a laser diode), a focusing lens assembly 64, a beam splitter 68 that forms a second axis A2, a collimating lens 70, and a reference element 72 having a reference surface 74. The interferometer 50 also includes along the second axis A2 a photodetector 80, such as CCD image sensor. An exemplary photodetector is a CCD camera having 4 Megapixels (MP). Not shown along the second axis A2 is an imaging lens disposed between the beam splitter 68 and the photodetector 80. Other configurations for the interferometer 50 can be effectively employed and the Fizeau configuration shown is by way of non-limiting example and for ease of illustration and discussion.

The photodetector 80 of the interferometer 50 is operably connected to a controller 90. In an example, the controller 90 comprises a programmable computer configured with a non-transitory computer readable medium for storing instructions for causing the controller to carry out the flatness measurement methods disclosed herein.

The system 40 also includes an adjustable support apparatus 100 configured to operably support the photomask 10. The support apparatus 100 includes a support base 110 having a top surface 112, a top end 116 and a bottom end 118. The surface 112 of the support apparatus 100 includes mask support members 126 and in a particular example includes two spaced apart bottom mask support members 126B and a top mask support member 126T (see FIG. 3A). Each support member 126 supports the photomask 10 at a support location. While three mask support members 126 and three support locations are generally preferred, more mask support members and support locations can also be used. The mask support members are designed to limit contact with the back surface 14 of the photomask 10 to avoid contamination and possible damage.

Figure 2B:
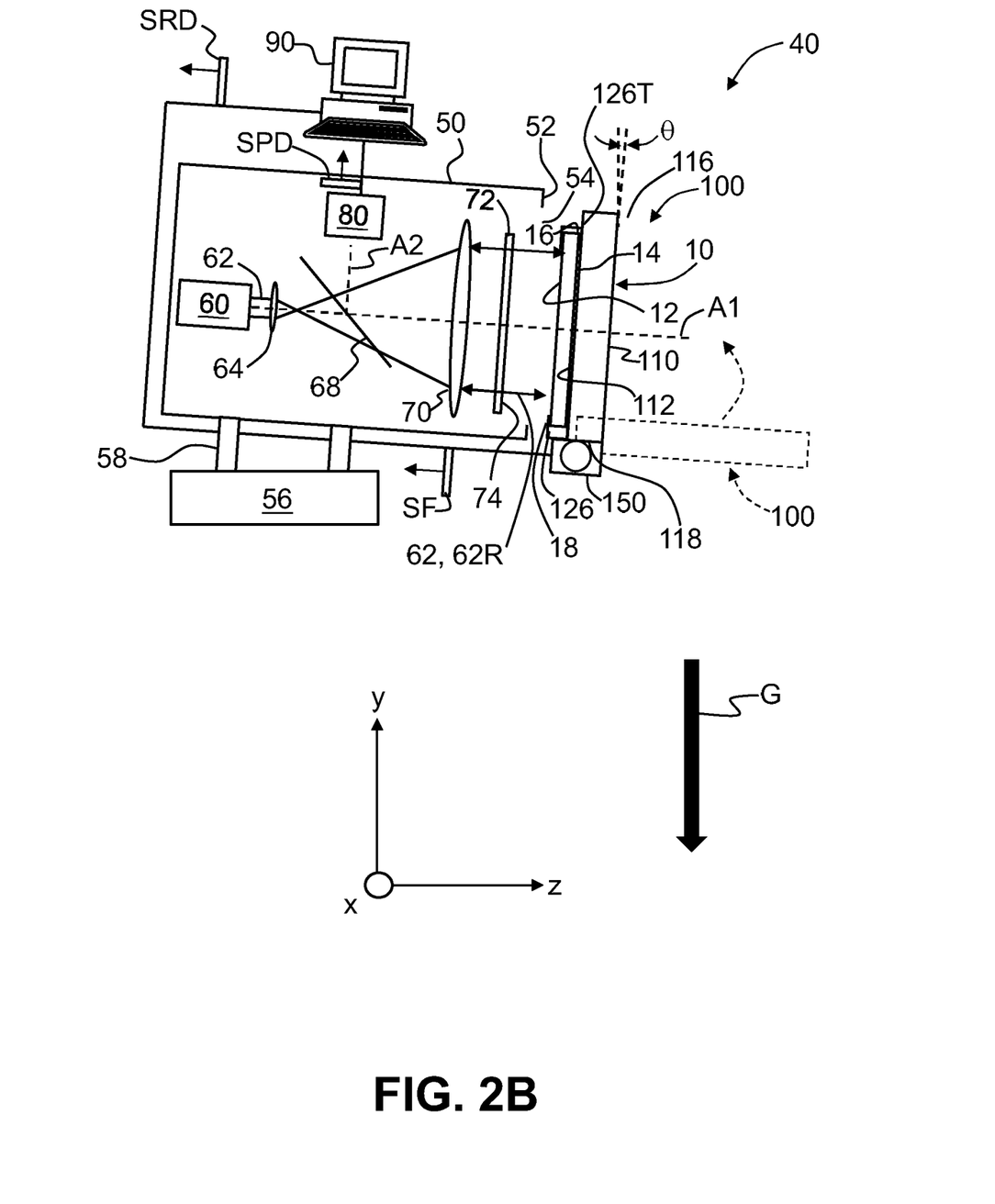
FIG. 2B is similar to FIG. 2A, but showing the photomask at a near-vertical position defined by a measurement angle $\theta$ and showing the optical path of the measurement light through the system to obtain an interferogram used to measure the flatness of the front surface of the photomask.

The support apparatus 100 also includes a rotation device 150 operably attached at the bottom end 118 of the support base 110 and configured to rotate the base (and the photomask operably supported thereon) between a horizontal (loading) position (x-z plane) as shown in FIG. 2A and a vertical (general measurement) position (x-y plane) or a select near-vertical position when making a flatness measurement, as shown in FIG. 2B. A measurement angle θ is defined as the angle between the vertical (x-y plane) and the surface 112 of the support base 110 or the front surface 12 of the photomask 10. The rotation device 150 is also operably (e.g., electrically) connected to the controller 90, which is configured to control the operation of the rotation device to set the support base 110 (and thus the photomask 10 supported thereon) to a select measurement angle θ via a rotation device control signal SRD. In an example, the measurement angle θ 0.2 radians.

In an example, the system 40 includes an interferometer support structure 56 that includes an anti-vibration device 58 to reduce or eliminate the adverse effects of vibration on the flatness measurement.

As shown in FIG. 2B and as noted above, the interferometer 50 is tiltable, i.e., is configured to be tilted at a small angle (typically 2° from horizontal) such that the interferometer axis A1 is tilted relative the x-z plane, e.g., by 2°. The rotation device 150 is used to move the photomask 10 between two nominal positions: a load position and a general measurement position. When the photomask 10 is in the general measurement position, it is parallel to the reference surface 74 of the interferometer 50. To change the tilt of the photomask with respect to the direction of gravity G, the interferometer 50 is tilted (e.g., by a couple of degrees) so that the photomask 10 and reference surface 74 move together. In an example, this can be accomplished by changing the tilt of the interferometer support structure 56 and/or by adjusting the anti-vibration device 58. It is assumed that the flatness of the reference surface 74 is not affected by gravity so that changes induced by gravity are limited to the photomask 10. In an example, the reference element 72 that includes the reference surface 74 is made sufficiently thick to prevent a substantial change to the reference surface flatness induced by gravity.

Figure 3A:
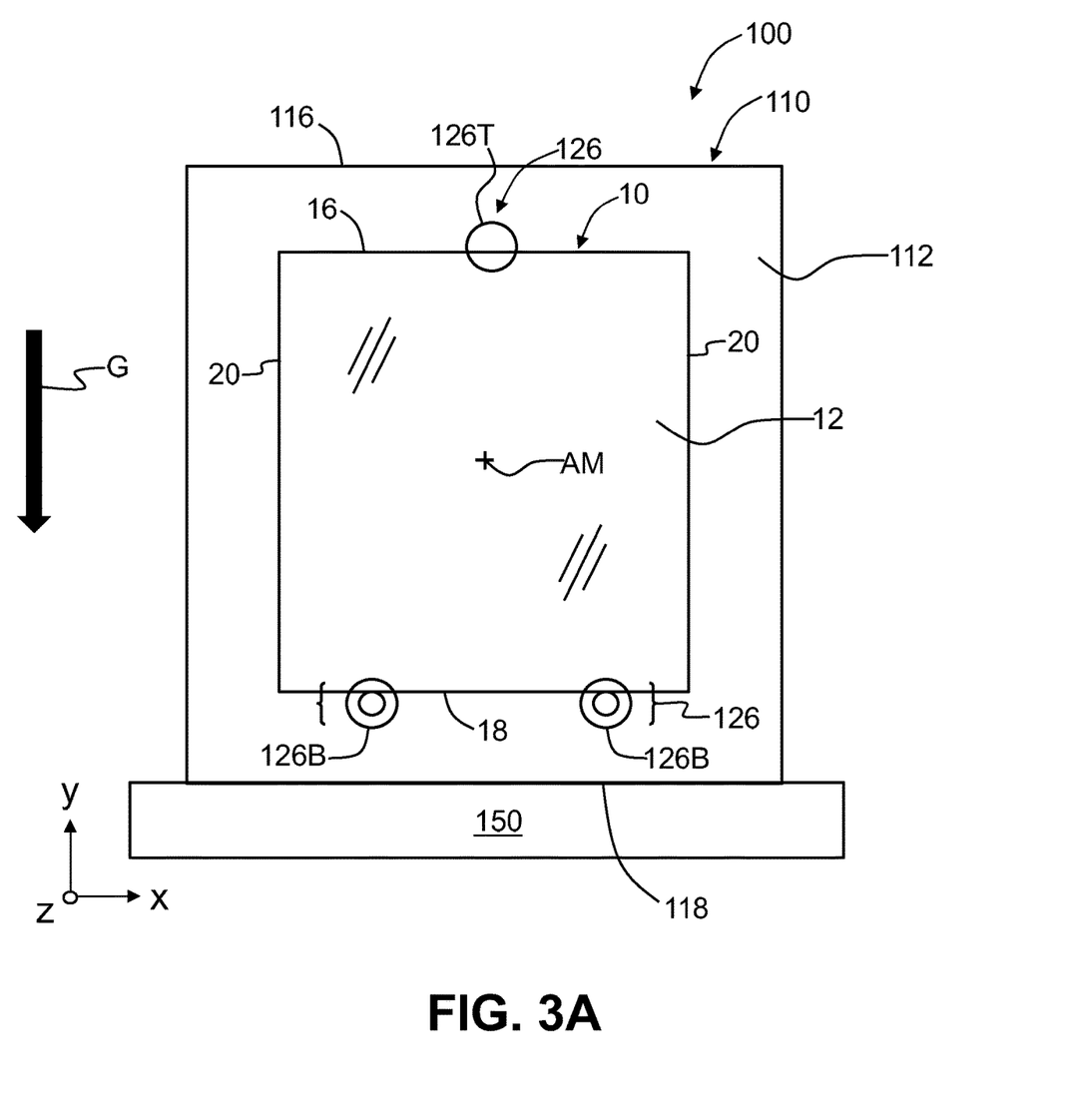
FIG. 3A is a front-on view of the photomask as supported by the support apparatus in the near-vertical position using two bottom support members and one top support member.
Figure 3B:
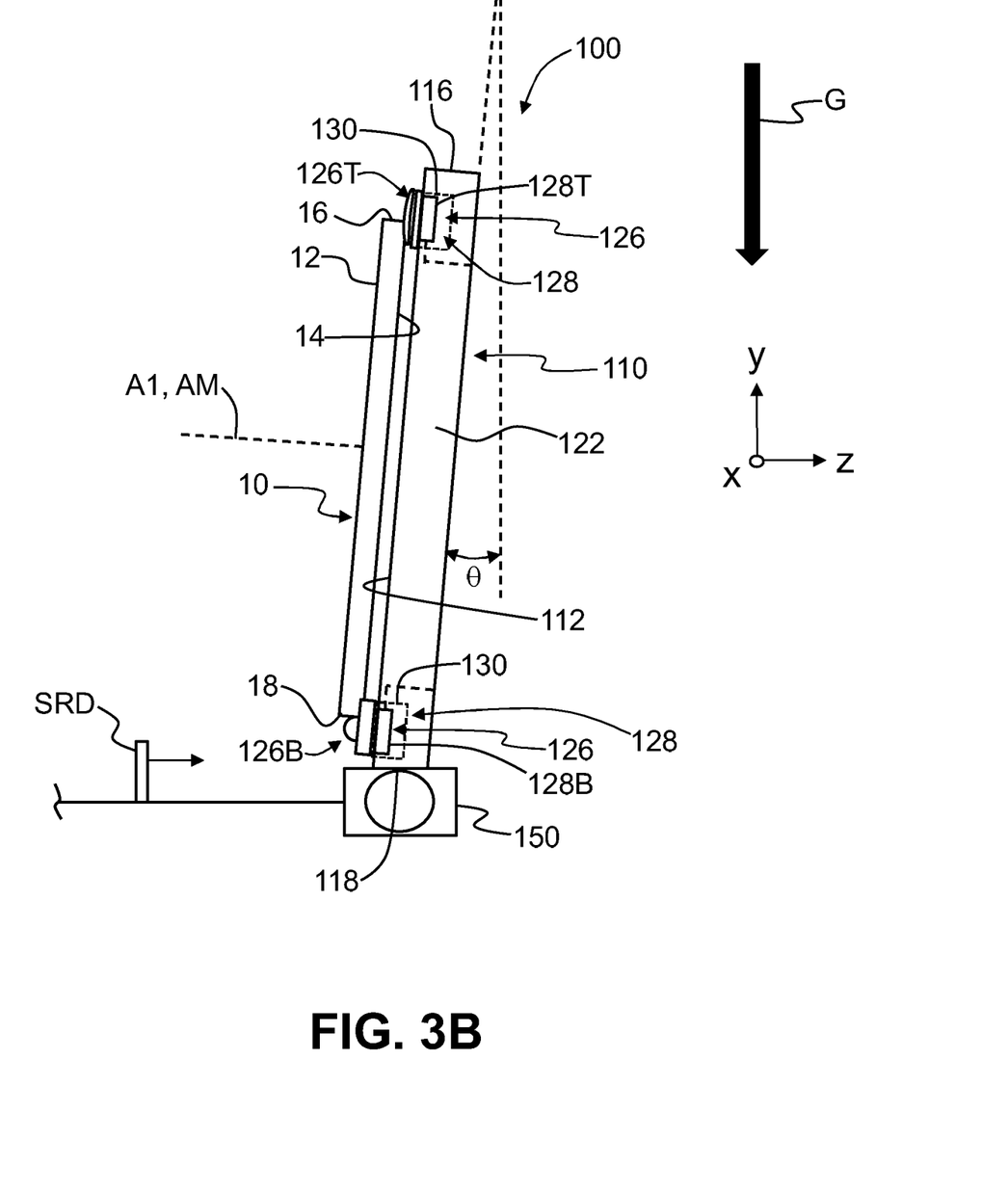
FIG. 3B is a side view of the support apparatus supporting the photomask in a near-vertical position using the top and bottom support members.
Figure 4A:
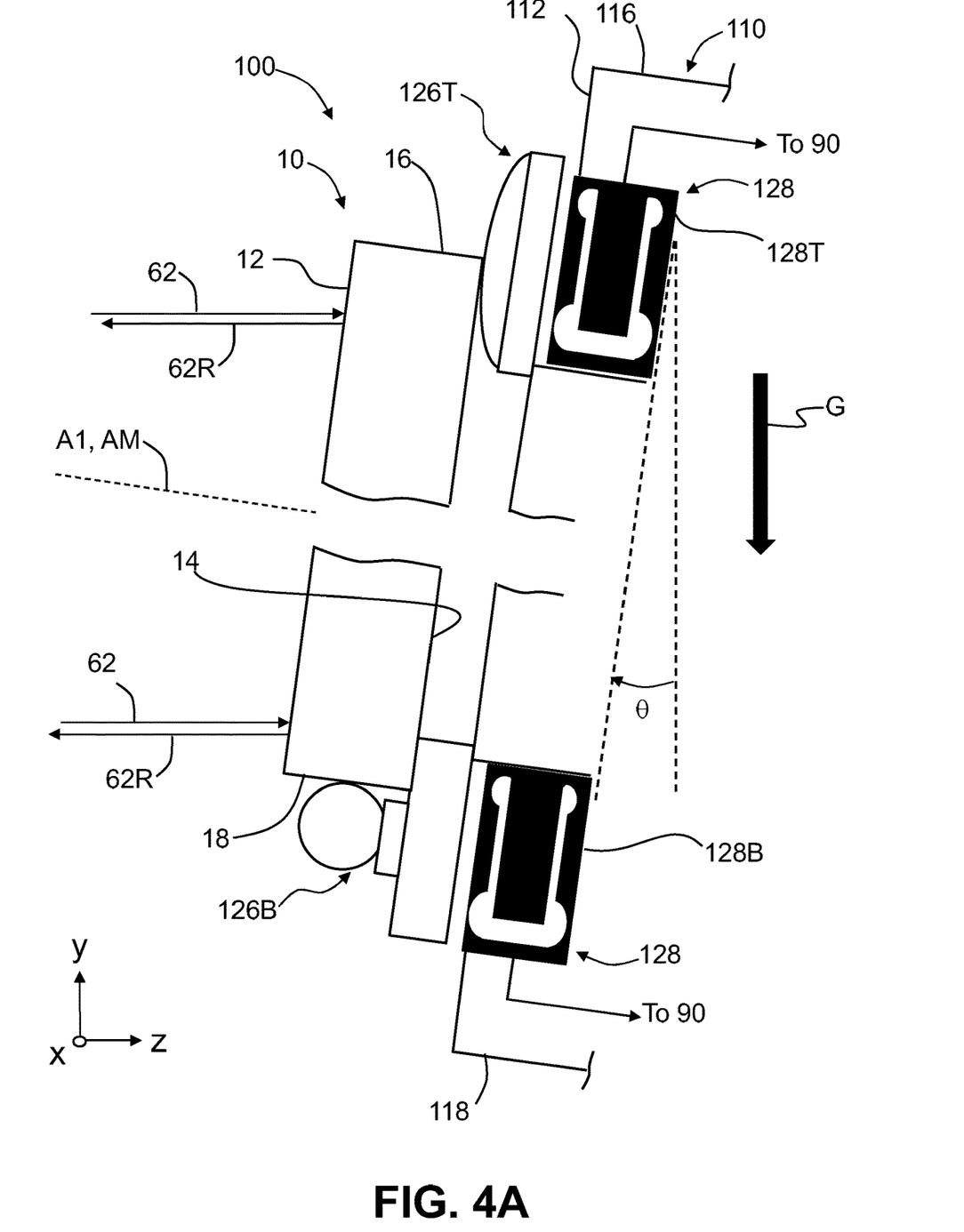
FIGS. 4A and 4B are close-up side cross-sectional views of the support apparatus and photomask supported thereon, showing the force sensors of the support members that measure a top force and a bottom force of the photomask against the support members and the transmission of respective top and bottom force signals to the controller, with FIG. 4A showing the support apparatus in a stand-off configuration and FIG. 4B showing the force-measurement configuration.
Figure 4B:
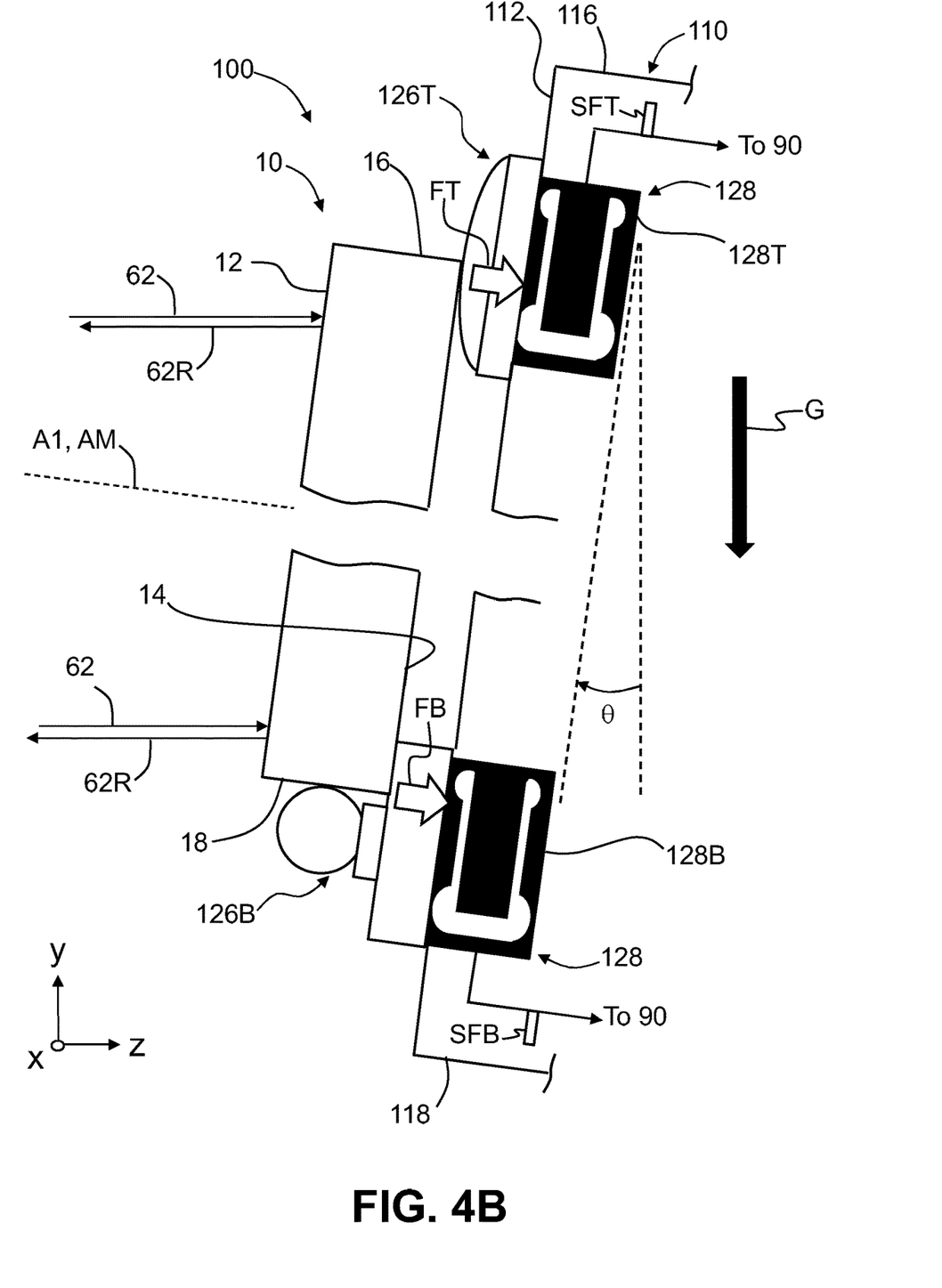

FIG. 3A is a front-on view and FIG. 3B is a side view of the support apparatus 100 in a near-vertical position and shows how the photomask 10 is supported by the bottom mask support members 126B and the top mask support member 126T at the measurement angle θ. FIGS. 4A and 4B are close-up side cross-sectional views of the support apparatus 100 and the photomask 10 supported thereon. FIG. 4A shows the support apparatus 100 in a stand-off configuration and FIG. 4B shows the support apparatus in a force-measurement configuration, as explained below. In FIGS. 4A and 4B, the direction of gravity is represented by a solid black arrow labeled G and is in the −y direction.

With reference to FIGS. 4A and 4B, at least one support member 126 includes a force sensor 128 since only a single force measurement is used in some of the methods disclosed herein. In the example shown in FIGS. 4A and 4B, the top support member 126T having a top force sensor 128T and each of the bottom support members 126B having a bottom force sensor 128B. Each force sensor 128 is electrically connected to the controller 90 and generates an electrical force signal representative of the amount of force it senses. Multiple force measurements at the different support members 126 can be used to provide measurement redundancy and/or to improve measurement accuracy.

In some cases, it is advantageous to set the photomask 10 in a measurement position without engaging the force sensors 128. For example, force measurements need not be made at the same time flatness measurements are being made with the interferometer 50. Also, it may be convenient to calibrate the force sensors 128 when the support apparatus 100 is moved into the measurement position. Thus, in an embodiment shown in FIG. 4A, the support apparatus 100 is configured to operate in a stand-off configuration where the force sensors 128 are not engaged with the support members 126. In the stand-off configuration, the force sensors 128 can be retracted relative to the support members 126. With referenced again to FIG. 3B, the support base 110 can be configured with a movable section 122 (in dashed outline) to which the support members 126 are attached that can be moved slightly (e.g., in the direction of the photomask central axis AM) to mechanically disconnect the mask support members 126 from their respective force sensors 128. In an alternate embodiment, the force sensors 128 can be respectively supported on movable mounts 130 that can be moved slightly to provide the mechanical disconnect between the force sensors and the support members to define the stand-off configuration.

FIG. 4B shows the photomask 10 in the force-measurement position which has the force sensors 128 engaged with the support members 126. In this configuration, the top force sensor 128T measures a top force FT and generates top force signal SFT representative of the top force, while the bottom force sensor 128B measures a bottom force FB and generates a bottom force signal SFB representative of the bottom force. Example types of force sensor 128 having the appropriate amount of measurement sensitivity include a flexural-based force sensor and a strain-based force sensor as is known in the art. As noted above, in an example, only one force sensor (e.g. the top force sensor 128T) is used to obtain force measurements.

Flatness Measurement Method

Both modeling and experimental data have confirmed that the gravity component of the photomask shape error is a linear function of the measurement angle θ over the range of measurement angles typically used when making flatness measurements (e.g., 0<10°, and further in an example, between 1° and 5°). Thus, the flatness measurement method disclosed herein generally includes making flatness measurements and force measurements at two different measurement positions as defined by two different measurement angles θ and then using the two flatness measurements and two force measurements to reduce if not eliminate the gravitational component of the flatness measurement, as well as flatness measurement errors due to the particular mounting configuration defined by the support members 126.

The method of measuring the flatness of the photomask 10 includes loading the photomask 10 onto the support members 126 of the support apparatus 100, as shown in FIG. 2A. The rotation device 150 of the support apparatus 100 is then activated by the controller 90 via a first rotation device control signal SRD that causes the support apparatus to set the photomask 10 to a first measurement angle $\theta=\theta_1$. In an example $\theta_1=2°$.

An interferometric measurement of the flatness of the front surface 12 of the photomask 10 is then made using the system 40 and the interferometer 50 therein. This includes activating the light source 60 to emit the light 62. The light 62 is expanded by the focusing lens assembly 64 and propagates to the collimating lens 70, which collimates the light. The collimated light 62 is then transmitted through the reference member 72 (including the reference surface 74) and through the aperture 54 to the front surface 12 of the photomask 10. The front surface 12 of the photomask 10 reflects the collimated light 62 back through the aperture 54 as reflected light 62R. The reflected light 62R passes through the reference member 72 (including the reference surface 74) and is redirected by the beam splitter 68 to be imaged onto the photodetector 80, which generates an electrical photodetector signal SPD representative of the detected light as a first digital image or first interferogram $IF_1$. The electrical photodetector signal SPD is then sent to the controller 90, which can perform signal processing (e.g., filtering) and then stores the captured first interferogram $IF_1$ associated with the first measurement angle $\theta_1$. In an example, the first interferogram $IF_1$ can be formed by combining multiple interferometric measurements (e.g., more than 2, and more preferably between 12 and 60) made at different nominal phase offsets.

When the photomask 10 is at the first measurement angle $\theta_1$, the top and bottom force sensors 128T and 128B measure respective first amounts of top and bottom force $FT_1$ and $FB_1$ of the photomask 10 pressing against the top and bottom mask support members 126T and 126B. For a photomask 10 that weighs about 300 grams, the top and bottom forces FT1 and FB1 can be about 6 grams and about 2 grams respectively for a measurement angle $\theta_1=2°$.

The detected first top and bottom forces $FT_1$ and $FB_1$ are respectively detected by the top and bottom force sensors 128T and 128B which in response generate respective first top and bottom force signals $SFT_1$ and $SFB_1$, which are sent to the controller 90 and are associated with the first measurement of the photomask 10 that generates the first interferogram $IF_1$.

Thus, a first measurement data set DS1 at the first measurement angle $\theta_1$ includes the first interferogram $IF_1$, and the first amounts of force $FT_1$ and $FB_1$. This data set DS1 can be represented in shorthand notation as DS1={$IF_1$, $FT_1$, $FB_1$} and is stored in the controller 90. Note that in our example support apparatus configuration that employs one top support member 126T and two bottom support members 126B, there will be one first top force signal SFT and two first bottom force signals SFB for each measurement angle $\theta$.

The force sensors 128 are designed to measure only that component of the gravitational force which is normal to the photomask surface, i.e., normal forces. If the mask support apparatus 100 is positioned to be at $\theta=0°$ with respect to the X-Y plane, the gravitational component that is normal to the photomask surface will reduce to a force which is nominally zero. For measurement angles $\theta$ that are small but not zero, the measured force will be linear with measurement angle. Since both the measured force, and the expected gravity-induced shape on the photomask surface are both linear with angle, it is not necessary to measure the measurement angle $\theta$ of the photomask support apparatus 100. However, at least an approximate measurement angle $\theta$ can be known by operation of the tiltable interferometer support structure 56 and/or by adjusting the anti-vibration device 58 and the different measurement angles referred to herein are a convenient way to distinguish between different flatness measurement conditions.

Once the first flatness measurement is completed and the first data set DS1 established and stored in the controller 90, the anti-vibration device 58 or support structure 56 can be adjusted to set the photomask 10 at a second measurement position as defined by a second measurement angle $\theta=\theta_2$ different from the first measurement angle $\theta_1$. In an example, the second measurement angle $\theta_2=3°$.

A second interferometric measurement of the flatness of the front surface 12 of the photomask 10 is then made using the system 40 as described above at the second measurement angle $\theta_2$ to obtain a second data set DS2={$IF_2$, $FT_2$, $FB_2$}, where $IF_2$ is a second interferogram and $FT_2$ and $FB_2$ are the second amounts of top and bottom force measured by the top and bottom force sensors 128T and 128B of the top and bottom support members 126T and 126B, respectively. If only one top force sensor (e.g. 128T) is used to measure the force, then the first and second data sets become DS1={$IF_1$, $F_1$} and DS2={$IF_2$, $F_2$}, where the "T" or the "B" has been dropped from the force symbol since there is only a single force sensor. As with the first interferogram $IF_1$, in an example, the second interferogram $IF_2$ can be formed by combining multiple interferometric measurements (e.g., more than 2, and more preferably between 12 and 60) made at different nominal phase offsets.

Next, a difference map DM between the two interferograms is calculated, e.g., DM=$IF_2$−$IF_1$. The difference map DM is an image that represents the gravitational sag, i.e., a measurement of the change in shape induced on the photomask 10 from the change in the amount of gravitational force on the mask due to the change $\Delta\theta=\theta_2-\theta_1$ in the measurement angle $\theta$. The difference map will also include any shape-induced errors from the configuration of the support apparatus 100.

Since the effect on the flatness measurement (i.e., photomask shape) due to gravity is linear with the measurement position (measurement angle $\theta$), the difference map DM can be scaled by a scaling factor S so that the scaled difference map (S·DM) corresponds to (i.e., is matched to) the contribution of gravity to one of the first or second interferograms $IF_1$ or $IF_2$ taken at the first or second measurement angle $\theta_1$ or $\theta_2$, respectively. The scaled difference map S·DM is denoted $DM_\theta$ to indicate that is it scaled to a select measurement angle $\theta$. The scaling factor $S_i=FT_i/\Delta F$ for the $i^{th}$ measurement angle $\theta_i$, where $\Delta F$ is the change in the measured force between the two measurement angles $\theta_2$ and $\theta_1$. The scaled difference map $DM_\theta$ is said to have a matched measurement angle with the given interferogram to which the difference map has been scaled. For the single force sensor embodiment, $\Delta F=F2-F1$. When using multiple force sensors 128, the force measurements from the sensors can be averaged to determine the forces F1 and F2.

For example, when the difference map DM is for a measurement (incremental) angle change $\Delta\theta=1°$, then using a scaling factor $S=FT_1/\Delta F=2$ provides a scaled difference map $DM_\theta=S·DM=2·DM$, which corresponds to the first measurement angle $\theta_1=2°$ and the first interferogram $IF_1$. Likewise, using a scaling factor $S=FT_2/\Delta F=3$ provides a scaled difference map $DM_\theta=S·DM=3·DM$, which corresponds to the second measurement $\theta_2=3°$ and the second interferogram $IF_2$. The two different scaling factors S can also respectively be referred to as first and second scaling factors and respectively denoted $S_1$ and $S_2$, respectively for convenience.

It is noted that the scaling factor S is inversely proportional to a difference $\theta_2-\theta_1$ between the second measurement angle $\theta_2$ and the first measurement angle $\theta_1$. Thus, in an example, the scaling factor S can be defined in terms of the measurement angles, i.e., $S=\theta_2/(\theta_2-\theta_1)$ or $S=\theta_1/(\theta_2-\theta_1)$.

Once the scaled difference map $DM_\theta$ is established, it is subtracted from the corresponding interferogram $IF_\theta$ (i.e., the interferogram having the measurement angle to which the difference map was scaled) to provide a compensated flatness measurement CFM, i.e., $$CFM = IF_\theta - DM_\theta$$

wherein the compensated flatness measurement comprises a flatness map of the photomask 10 having minimal contributions due to gravity effects and the support apparatus 100. In one example $CFM = IF_1 - 2 \cdot DM$ (measurement angle $\theta = \theta_1 = 2°$) while in another example $CFM = IF_2 - 3 \cdot DM$ (measurement angle $\theta = \theta_2 = 3°$). In an example, two compensated flatness measurements CFM can be calculated, one for each measurement angle $\theta$, and the results averaged. In another example, measurements at more than two measurement angles $\theta$ can be made and more than two compensated flatness measurements CFM can be calculated and two or more of the results averaged. The compensated flatness measurement CFM can be used to classify the photomask on the basis of the flatness of its surface. For example, an application may require a photomask that meets a certain surface flatness specification and the compensated flatness measurement CFM of the photomask can be used to determine whether the photomask meets the specification. Photomasks that meet the specification can be selected for the application and photomasks that fail to meet the specification can be rejected for the application. The compensated flatness measurement CFM includes use of the scaled difference map DM to classify the photomask.

Advantages

The flatness measurement systems and methods for photomasks 10 as described herein have at least the following advantages over conventional flatness measurement methods for photomask.

A first advantage is increased measurement throughput since rotation of the photomask about its central axis AM to different rotation angles is not required. In an example, the measurement throughput is increased by a factor of between 2× and 3×.

A second advantage is that multiple photomask handling steps that put the photomask at risk of contamination and/or damage are eliminated. The movement of the photomask to different measurement angles $\theta$ does not require removing the photomask from the support apparatus.

A third advantage is that the symmetric component of gravitational sag that results in residual measurement error can be reduced or eliminated.

A fourth advantage is that the measurement methods account for variations between different photomasks, such as geometrical variations and different flatness shapes which may have an impact on the resulting error shape induced by gravity.

Aspect 1 of the description is:
A method of interferometrically measuring flatness of a photomask supported at a support location, comprising:
recording at first and second measurement positions respective first and second interferograms of a surface of the photomask, and measuring respective first and second normal forces $F_1$ and $F_2$ at the support location, wherein the first and second measurement positions define a difference $\Delta F = F_2 - F_1$ in the normal force;
defining a difference map as a difference between the first and second interferograms; and
using the difference in normal force $\Delta F$ and the normal force $F_1$ at the first measurement position to define a scaling factor S and applying the scaling factor S to the difference map to define a scaled difference map.

Aspect 2 of the description is:
The method according to aspect 1, further comprising:
defining a compensated flatness by subtracting the scaled difference map from the first interferogram.

Aspect 3 of the description is:
The method according to aspect 1 or 2, wherein the photomask comprises an extreme ultraviolet (EUV) photomask.

Aspect 4 of the description is:
The method according to any of aspects 1-3, wherein the photomask is a patterned photomask.

Aspect 5 of the description is:
The method according to any of aspects 1-4, wherein the recording of the first and second interferograms is performed using a Fizeau interferometer.

Aspect 6 of the description is:
The method according to aspect 5, further comprising adjusting the Fizeau interferometer between first and second measurement angles $\theta_1$ and $\theta_2$ that define the first and second measurement positions.

Aspect 7 of the description is:
The method according to aspect 6, wherein the first and second measurement angles $\theta_1$ and $\theta_2$ are between 1° and 5°.

Aspect 8 of the description is:
The method according to any of aspects 1-7, wherein the photomask is supported by an adjustable support apparatus that comprises three support members configured to provide three support locations for the photomask.

Aspect 9 of the description is:
The method according to aspect 8, wherein the adjustable support apparatus is configured to place the photomask in a stand-off configuration.

Aspect 10 of the description is:
The method according to aspect 9, wherein the recording of the first and second interferograms is performed in the stand-off configuration.

Aspect 11 of the description is:
The method according to any of aspects 1-10, further comprising:
recording a first plurality of interferograms at the first measurement position and combining the first plurality of interferograms to form the first interferogram; and
recording a second plurality of interferograms at the second measurement position and combining the second plurality of interferograms to form the second interferogram.

Aspect 12 of the description is:
The method according to aspect 11, wherein the first plurality of interferograms comprises between 12 and 60 interferograms and the second plurality of interferograms comprises between 12 and 60 interferograms.

Aspect 13 of the description is:
The method of any of aspects 1-12, further comprising classifying the photomask based on the scaled difference map.

Aspect 14 of the description is:
A method of interferometrically measuring flatness of a photomask, comprising:
recording at first and second measurement angles $\theta_1$ and $\theta_2$ respective first and second interferograms $IF_1$ and $IF_2$ of a surface of the photomask supported by an adjustable support apparatus, wherein $\theta_2 > \theta_1$ and wherein $\theta_1$ and $\theta_2$ are each within 11.46° of vertical;
measuring at the first and second measurement angle $\theta_1$ and $\theta_2$ respective first and second normal forces $F_1$ and $F_2$ of the photomask on the adjustable support apparatus, wherein a force difference $\Delta F = F_2 - F_1$;
defining a difference map $DM = IF_2 - IF_1$ as a difference between the second and first interferograms $IF_2$ and $IF_1$;

defining either a first scaled difference map $DM_1=(F_1/\Delta F)\cdot DM$ or a second scaled difference map $DM_2=(F_2/\Delta F)\cdot DM$; and defining a compensated flatness measurement CFM by either:

subtracting the first difference map from the first interferogram ($CFM=IF_1-DM_1$); or subtracting the second difference map from the second interferogram ($CFM=IF_2-DM_2$).

Aspect 15 of the description is:
The method according to aspect 14, wherein the photomask comprises an extreme ultraviolet (EUV) photomask.

Aspect 16 of the description is:
The method according to aspect 14 or 15, wherein the photomask is a patterned photomask.

Aspect 17 of the description is:
The method according to any of aspects 14-16, wherein the recording of the first and second interferograms is performed using a Fizeau interferometer.

Aspect 18 of the description is:
The method according to aspect 17, wherein the Fizeau interferometer is adjustable to define the first and second measurement angles $\theta_1$ and $\theta_2$.

Aspect 19 of the description is:
The method according to any of aspects 14-18, further comprising supporting the photomask on a support apparatus comprising two base support members and a top support member, wherein the top support member is operably connected to a force sensor, and determining the first and second normal forces $F_1$ and $F_2$ using the force sensor.

Aspect 20 of the description is:
The method according to aspect 19, wherein the photomask has a back surface and wherein the adjustable support apparatus comprises three support members configured to provide three support locations for the photomask.

Aspect 21 of the description is:
The method according to any of aspects 14-20, wherein the adjustable support apparatus is configured to place the photomask in a stand-off configuration.

Aspect 22 of the description is:
The method according to aspect 21, wherein the recording of the first and second interferograms is performed is in the stand-off configuration.

Aspect 23 of the description is:
The method according to any of aspects 14-22, wherein the measurement angles $\theta_1$ and $\theta_2$ are between 1° and 5°.

Aspect 24 of the description is:
The method according to any of aspects 14-23, wherein:
the first interferogram $IF_1$ is formed by combining multiple recorded first interferograms; and
the second interferogram $IF_2$ is formed by combining multiple recorded second interferograms.

Aspect 25 of the description is:
The method according to aspect 24, wherein the multiple recorded first interferograms comprise between 12 and 60 first interferograms and the multiple recorded second interferograms comprise between 12 and 60 second interferograms.

Aspect 26 of the description is:
The method of any of aspects 1-25, further comprising classifying the photomask based on the scaled difference map.

Aspect 27 of the description is:
A support apparatus for an interferometric measurement system for measuring flatness of a photomask having a back surface, a bottom end and a top end, comprising:

a support base comprising at least three support members, the at least three support members comprising two bottom support members that support the bottom end of the photomask and a top support member that supports the photomask at or adjacent the top end of the photomask;

a rotation device mechanically attached to the support base and configured to rotate the support base to a measurement position relative to the interferometric measurement system;

a top force sensor in mechanical communication with the top support member; and wherein the at least three support members are arranged to mechanically support the photomask by contacting the photomask so that the top force sensor measures an amount of force on the top support member from the photomask due to gravity.

Aspect 28 of the description is:
The support apparatus according to aspect 27, wherein the top force sensor comprises either a flexural-based force sensor or a strain-based force sensor.

Aspect 29 of the description is:
The support apparatus according to aspect 27 or 28, further comprising two bottom force sensors respectively in mechanical communication the two base support members.

Aspect 30 of the description is:
The support apparatus according to any of aspects 27-29, wherein the support base has an end and wherein the rotation device resides at or near the end of the support base.

Aspect 31 of the description is:
An interferometric flatness measurement system for measuring flatness of a photomask, comprising:
the support apparatus according to aspect 27; and
an interferometer operably arranged adjacent the support apparatus and that is tiltable relative to the support apparatus.

Aspect 32 of the description is:
The interferometric measurement system according to aspect 31, wherein the interferometer comprises a Fizeau interferometer.

Aspect 33 of the description is:
The interferometric measurement system according to aspect 31 or 32, wherein the support apparatus is configured to move the photomask between a stand-off configuration and a force-measurement configuration.

Aspect 34 of the description is:
A method of measuring flatness of a photomask, comprising:
positioning a photomask at a first measurement position, the first measurement position having a first measurement angle $\theta_1$ relative to a vertical direction;

recording a first interferogram $IF_1$ of a surface of the photomask at the first measurement position;

repositioning the photomask to a second measurement position, the second measurement position having a second measurement angle $\theta_2$ relative to the vertical direction;

recording a second interferogram $IF_2$ of the surface of the photomask at the second measurement position;

computing a difference map DM by subtracting the first interferogram $IF_1$ from the second interferogram $IF_2$; and computing a scaled difference map $DM_\theta$ by multiplying the difference map DM by a scaling factor S, the scaling factor S being computed from a first measurement of the photomask made at the first measurement position and a second measurement of the photomask made at the second measurement position.

Aspect 35 of the description is:
The method of aspect 34, wherein the first measurement is a measurement of the first measurement angle $\theta_1$ and the second measurement is a measurement of the second measurement angle $\theta_2$.

Aspect 36 of the description is:
The method of aspect 34 or 35, wherein the scaling factor S is inversely proportional to a difference $\theta_2-\theta_1$ between the second measurement angle $\theta_2$ and the first measurement angle $\theta_1$.

Aspect 37 of the description is:
The method of aspect 36, wherein the scaling factor $S=\theta_1/(\theta_2-\theta_1)$.

Aspect 38 of the description is:
The method of aspect 34, wherein the first measurement is a measurement of a normal force $F_1$ at a first location of the photomask positioned at the first measurement position and the second measurement is a measurement of a normal force $F_2$ at a second location of the photomask positioned at the second measurement position.

Aspect 39 of the description is:
The method of aspect 38, wherein the scaling factor S is inversely proportional to a difference $F_2-F_1$ between the normal force $F_2$ at the second measurement position and the normal force $F_1$ at the first measurement position.

Aspect 40 of the description is:
The method of aspect 39, wherein the scaling factor $S=F_1/(F_2-F_1)$.

Aspect 41 of the description is:
The method of any of aspects 38-40, wherein the first location is the same as the second location.

Aspect 42 of the description is:
The method of any of aspects 34-41, further comprising subtracting the scaled difference map $DM_\theta$ from the first interferogram $IF_1$.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A method of interferometrically measuring flatness of a photomask supported at a support location, comprising:
   recording at first and second measurement positions respective first and second interferograms of a surface of the photomask, and measuring respective first and second normal forces $F_1$ and $F_2$ at the support location, wherein the first and second measurement positions define a difference $\Delta F=F_2-F_1$ in the normal force;
   defining a difference map as a difference between the first and second interferograms; and
   using the difference in normal force $\Delta F$ and the normal force $F_1$ at the first measurement position to define a scaling factor S and applying the scaling factor S to the difference map to define a scaled difference map.

2. The method according to claim 1, further comprising: defining a compensated flatness by subtracting the scaled difference map from the first interferogram.

3. The method according to claim 1, wherein the photomask comprises an extreme ultraviolet (EUV) photomask.

4. The method according to claim 1, wherein the photomask is a patterned photomask.

5. The method according to claim 1, wherein the recording of the first and second interferograms is performed using a Fizeau interferometer.

6. The method according to claim 5, further comprising adjusting the Fizeau interferometer between first and second measurement angles $\theta_1$ and $\theta_2$ that define the first and second measurement positions.

7. The method according to claim 6, wherein the first and second measurement angles $\theta_1$ and $\theta_2$ are between 1° and 5°.

8. The method according to claim 1, wherein the photomask is supported by an adjustable support apparatus that comprises three support members configured to provide three support locations for the photomask, the adjustable support apparatus configured to place the photomask in a stand-off configuration, the recording of the first and second interferograms performed in the stand-off configuration.

9. The method according to claim 1, further comprising:
   recording a first plurality of interferograms at the first measurement position and combining the first plurality of interferograms to form the first interferogram; and
   recording a second plurality of interferograms at the second measurement position and combining the second plurality of interferograms to form the second interferogram.

10. The method of claim 1, further comprising classifying the photomask based on the scaled difference map.

11. A method of interferometrically measuring flatness of a photomask, comprising:
   recording at first and second measurement angles $\theta_1$ and $\theta_2$ respective first and second interferograms $IF_1$ and $IF_2$ of a surface of the photomask supported by an adjustable support apparatus, wherein $\theta_2>\theta_1$ and wherein $\theta_1$ and $\theta_2$ are each within 11.46° of vertical;
   measuring at the first and second measurement angle $\theta_1$ and $\theta_2$ respective first and second normal forces $F_1$ and $F_2$ of the photomask on the adjustable support apparatus, wherein a force difference is defined as $\Delta F=F_2-F_1$;
   defining a difference map $DM=IF_2-IF_1$ as a difference between the second and first interferograms $IF_2$ and $IF_1$;
   defining either a first scaled difference map $DM_1=(F_1/\Delta F)\cdot DM$ or a second scaled difference map $DM_2=(F_2/\Delta F)\cdot DM$; and
   defining a compensated flatness measurement CFM by either:
   i) subtracting the first difference map from the first interferogram ($CFM=IF_1-DM_1$); or
   ii) subtracting the second difference map from the second interferogram ($CFM=IF_2-DM_2$).

12. The method according to claim 11, further comprising supporting the photomask on a support apparatus comprising two base support members and a top support member, wherein the top support member is operably connected to a force sensor, and determining the first and second normal forces $F_1$ and $F_2$ using the force sensor.

13. The method according to claim 11, wherein the measurement angles $\theta_1$ and $\theta_2$ are between 1° and 5°.

* * * * *

UNITED STATES PATENT AND TRADEMARK OFFICE
CERTIFICATE OF CORRECTION

PATENT NO. : 10,871,369 B2
APPLICATION NO. : 16/527917
DATED : December 22, 2020
INVENTOR(S) : Thomas James Dunn et al.

Page 1 of 1

It is certified that error appears in the above-identified patent and that said Letters Patent is hereby corrected as shown below:

On the Title Page

On page 2, in Column 2, item (56), Other Publications, Line 10, delete "Metroloty" and insert -- Metrology --, therefor.

Signed and Sealed this
Thirtieth Day of March, 2021

Drew Hirshfeld
*Performing the Functions and Duties of the
Under Secretary of Commerce for Intellectual Property and
Director of the United States Patent and Trademark Office*